(12) United States Patent
Honda

(10) Patent No.: US 7,292,309 B2
(45) Date of Patent: Nov. 6, 2007

(54) EXPOSURE APPARATUS AND DEVICE MANUFACTURING METHOD

(75) Inventor: Tokuyuki Honda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 365 days.

(21) Appl. No.: 10/538,467

(22) PCT Filed: Dec. 13, 2004

(86) PCT No.: PCT/JP2004/018958

§ 371 (c)(1),
(2), (4) Date: Jun. 8, 2005

(87) PCT Pub. No.: WO2005/062351

PCT Pub. Date: Jul. 7, 2005

(65) Prior Publication Data

US 2006/0050257 A1    Mar. 9, 2006

(30) Foreign Application Priority Data

Dec. 19, 2003  (JP) ............................. 2003-422932

(51) Int. Cl.
*G03B 27/42* (2006.01)
*G03B 27/52* (2006.01)

(52) U.S. Cl. .......................... 355/53; 355/55

(58) Field of Classification Search ................. 355/53, 355/55, 72; 430/322, 311; 427/430.1; 438/584
See application file for complete search history.

(56) References Cited

U.S. PATENT DOCUMENTS

| | | | |
|---|---|---|---|
| 5,175,124 A | * | 12/1992 | Winebarger .................. 438/584 |
| 5,825,043 A | | 10/1998 | Suwa |
| 6,191,429 B1 | | 2/2001 | Suwa |
| 2005/0024609 A1 | * | 2/2005 | De Smit et al. ............... 355/18 |
| 2005/0074704 A1 | * | 4/2005 | Endo et al. .................. 430/322 |

FOREIGN PATENT DOCUMENTS

| | | |
|---|---|---|
| EP | 0834773 A2 | 4/1996 |
| EP | 1486827 | 12/2004 |
| JP | 10-154659 | 6/1998 |
| JP | 10-303114 | 11/1998 |
| JP | 10-340846 | 12/1998 |
| JP | 11-176727 A | 7/1999 |
| JP | 2004-282023 | 10/2004 |
| JP | 2005-005713 A | 1/2005 |
| WO | 99/49504 A1 | 9/1999 |
| WO | 2004/090956 A1 | 10/2004 |

OTHER PUBLICATIONS

International Search Report dated May 3, 2005.

* cited by examiner

*Primary Examiner*—Peter B. Kim
(74) *Attorney, Agent, or Firm*—Morgan & Finnegan LLP

(57) ABSTRACT

An exposure apparatus includes a projection optical system (3) for projecting a pattern of a mask (2) onto a substrate (5), and a fluid supply unit (6) for supplying a fluid between said projection optical system and the substrate, said fluid supply unit (6) including an injection unit (19) for injecting carbon dioxide into the fluid.

8 Claims, 9 Drawing Sheets

EXPOSURE APPARATUS AND DEVICE MANUFACTURING METHOD

TECHNICAL FIELD

This invention relates generally to an exposure apparatus that utilizes an immersion method, and is suitable, for example, for the lithography process for manufacturing highly integrated devices, such as semiconductor devices, e.g., ICs and LSIs, image pick-up devices, e.g., CCDs, display devices, e.g., a liquid crystal panels, communication devices, e.g., optical waveguides, and magnetic heads by transferring a pattern of a mask (or a reticle) onto a photosensitive agent applied substrate.

BACKGROUND ART

An exposure apparatus for exposing a mask pattern onto a photosensitive-agent applied substrate have conventionally been used to manufacture semiconductor devices and liquid crystal panels. Since finer processing of a pattern is demanded for improved integrations of devices, exposure apparatuses are improved so as to resolve fine patterns.

The following Rayleigh equation (1) defines resolution R of a projection optical system in an exposure apparatus, which is an index of a size of a resolvable pattern:

$$R = k_1(\lambda/NA) \quad (1)$$

where $\lambda$ is an exposure wavelength, NA is a numerical aperture of the projection optical system at its image side, and $k_1$ is a constant determined by a development process and others, which usually is approximately 0.5.

As understood from Equation (1), the resolving power of the optical system in the exposure apparatus becomes higher as the exposure wavelength is shorter and the image-side NA of the projection optical system is greater.

Therefore, following the mercury lamp i-line (with approximately 365 nm in wavelength), a KrF excimer laser (with approximately 248 nm in wavelength) and an ArF excimer laser (with approximately 193 nm in wavelength) have been developed, and more recently an $F_2$ excimer laser (with approximately 157 nm in wavelength) is reduced to practice. However, a selection of the exposure light having a shorter wavelength makes it difficult to meet material requirements with respect to transmittance, uniformity and durability, etc., causing an increasing cost of the apparatus.

An exposure apparatus having a projection optical system with a NA of 0.85 is commercially available, and a projection optical system with a NA of 0.9 or greater is researched and developed. Such a high-NA exposure apparatus has difficulties in maintaining good imaging performance with little aberration over a large area, and thus utilizes a scanning exposure system that synchronizes the mask with a substrate during exposure.

However, a conventional design cannot make the NA greater than 1 in principle due to a gas layer having a refractive index of about 1 between the projection optical system and the substrate.

On the other hand, an immersion method is proposed as means for improving the resolving power by equivalently shortening the exposure wavelength. It is a method used for the projection exposure, which fills liquid in a space between the final surface of the projection optical system and the substrate, instead of filling this space with air as in the prior art. The projection exposure apparatus uses, as the immersion method, a method for immersing the final surface of the projection optical system and the entire substrate in the liquid tank (see, for example, Japanese Patent Application, Publication No. 6-124873), and a local fill method that flows the fluid only in the space between the projection optical system and the substrate (see, for example, International Publication No. WO99/49504 pamphlet).

The immersion method has an advantage in that the equivalent exposure wavelength has a wavelength of a light source times 1/n, where n is a refractive index of the used liquid. This means that the resolving power enhances by 1/n times the conventional resolving power, even when the light source having the same wavelength is used.

For example, when the light source has a wavelength of 193 nm and the fluid is the water, the refractive index is about 1.44. Therefore, use of the immersion method can improve the resolving power by 1/1.44 times the conventional method.

The most common fluid used for the immersion method is water. The water has a good transmittance relative to the ultraviolet light down to about 190 nm. In addition, advantageously, a large amount of water is used in the semiconductor manufacturing process, and the water gets along with the wafer and photosensitive agent.

It is important to reduce the influence of the air gas bubbles to the exposure in the immersion exposure apparatus. These gas bubbles that enter the exposure area between the final surface of the projection optical system and the substrate scatter the exposure light. Therefore, the transferred pattern's critical dimension varies beyond the permissible range, causing insulations and short circuits contrary to the design intent in the worst case. Degassing of the fluid is the most effective, known method to prevent the influence of the gas bubbles to the exposure. Since the gas bubbles are unlikely to occur or the generated gas bubbles extinguish in a short time period in the degassed fluid, the influence of the gas bubbles to the exposure is prevented.

However, the water widely used for the immersion method increases the resistivity, when degassed, and is likely to generate static electricity disadvantageously. For example, the pure water (i.e., the water containing few impurities) used for the semiconductor manufacturing process reaches the resistivity of 18 M$\Omega$·cm after degas. The substrate surface is electrically insulated since the photosensitive agent is applied on it. Therefore, as the stage moves the substrate, the static electricity is generated on the substrate surface and makes the device on the substrate defective.

DISCLOSURE OF INVENTION

With the foregoing in mind, the present invention has an exemplary object to provide an exposure apparatus that uses an immersion method while reducing the static electricity on the substrate.

An exposure apparatus according to one aspect of the present invention includes a projection optical system for projecting a pattern of a mask onto a substrate, and a fluid supply unit for supplying a fluid between the projection optical system and the substrate, the fluid supply unit including an injection unit for injecting carbon dioxide into the fluid.

An exposure apparatus according to another aspect of the present invention includes an illumination optical system for illuminating a mask using light from a light source, and a projection optical system for projecting a pattern of the mask onto a substrate, wherein a fluid supplied to a space between the projection optical system and the substrate has a concentration of carbon dioxide between 0.02 ppm and 750 ppm.

An exposure apparatus according to still another aspect of the present invention includes an illumination optical system for illuminating a mask using light from a light source, and a projection optical system for projecting a pattern of the mask onto a substrate, wherein a fluid supplied to a space between the projection optical system and the substrate has a resistivity value between 0.02 MΩ·cm and 10 MΩ·cm.

A device manufacturing method according to another aspect of the present invention includes the steps of exposing an object using the above exposure apparatus, and developing the exposed object.

Other objects and further features of the present invention will become readily apparent from the following description of the embodiments with reference to accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Preferred embodiments of the present invention will now be described in detail in accordance with the accompanying drawings.

First Embodiment

Figure 1:
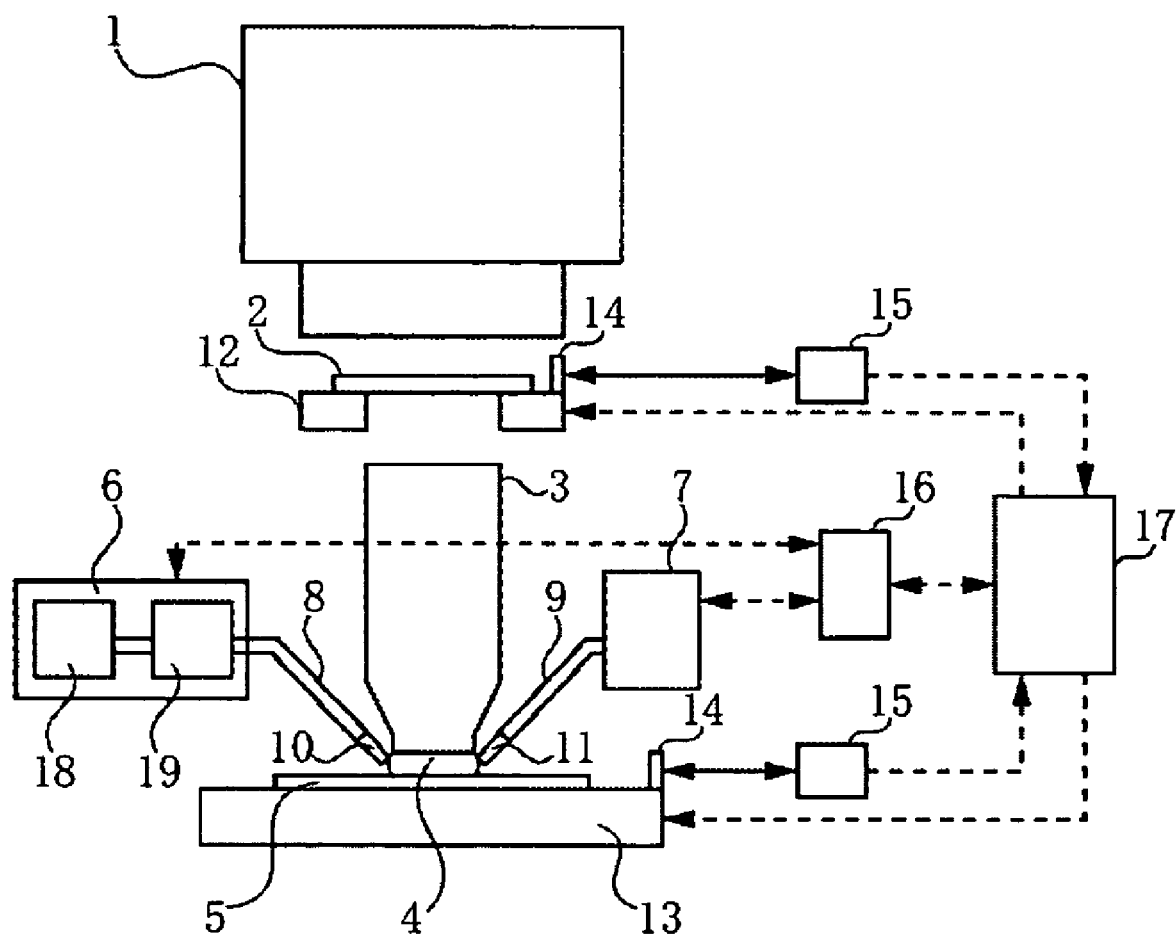
FIG. 1 is a schematic view of a principal part in an exposure apparatus of a first embodiment.

FIG. 1 is a schematic view of a principal part of an exposure according to a first embodiment. This embodiment applies the present invention to a scanning exposure apparatus.

In FIG. 1, 1 denotes an illumination optical system for illuminating a reticle (or a mask) with light from a light source. The light source is an ArF excimer laser (with a wavelength of 193 nm), a KrF excimer laser (with a wavelength of 248 nm), and $F_2$ laser, and the illumination optical system 1 includes a known optical system etc. (not shown). 3 denotes a refracting or catadioptric or another projection optical system for projecting a circuit pattern of a reticle 2 illuminated by the illumination optical system 1, onto a wafer 5 (substrate) as a second object. 15 denotes a distance measuring laser interferometer for measuring a two-dimensional position on a horizontal plane of each of a reticle stage 12 and a wafer stage 13 via a reference mirror 14. A stage controller 17 controls positioning and synchronizations of the reticle 2 and the wafer 5 based on this measurement value. The wafer stage 13 serves to adjust a position in a longitudinal direction, a rotational angle, and an inclination of a wafer so that the surface of the wafer 5 matches the image surface of the projection optical system 3.

This embodiment uses the immersion method to shorten the equivalent exposure wavelength, and improve the exposure resolution. Therefore, this embodiment arranges a supply port 10 and a recovery port 11 around the final surface of the projection optical system 3, supply the water between the final surface of the projection optical system 3 and the wafer 5, and form a liquid film 4 there. An interval between the final surface of the projection optical system 3 and the wafer 5 is preferably small enough to stably form the liquid film 4, such as 0.5 mm. The supply port 10 is connected via a supply tube 8 to a fluid supply unit 6 that supplies the water. The recovery port 11 is connected via a recovery tube 9 to a fluid recovery unit 7 that recovers the water. The fluid supply unit 6 includes a degassing unit 18 and a carbon dioxide injection unit 19 provided at the downstream of the degassing unit 18. The degassing unit 18 can have, for example, a well-known membrane module (not shown) and a vacuum pump (not shown). An immersion controller 16 sends a control signal to the fluid supply unit 6 and the fluid recovery unit 7, and transmits and receives data with a stage controller 17. Thereby, the immersion controller 16 adjusts the liquid supply amount and recovery amount according to the wafer's moving direction and speed.

Figure 2:
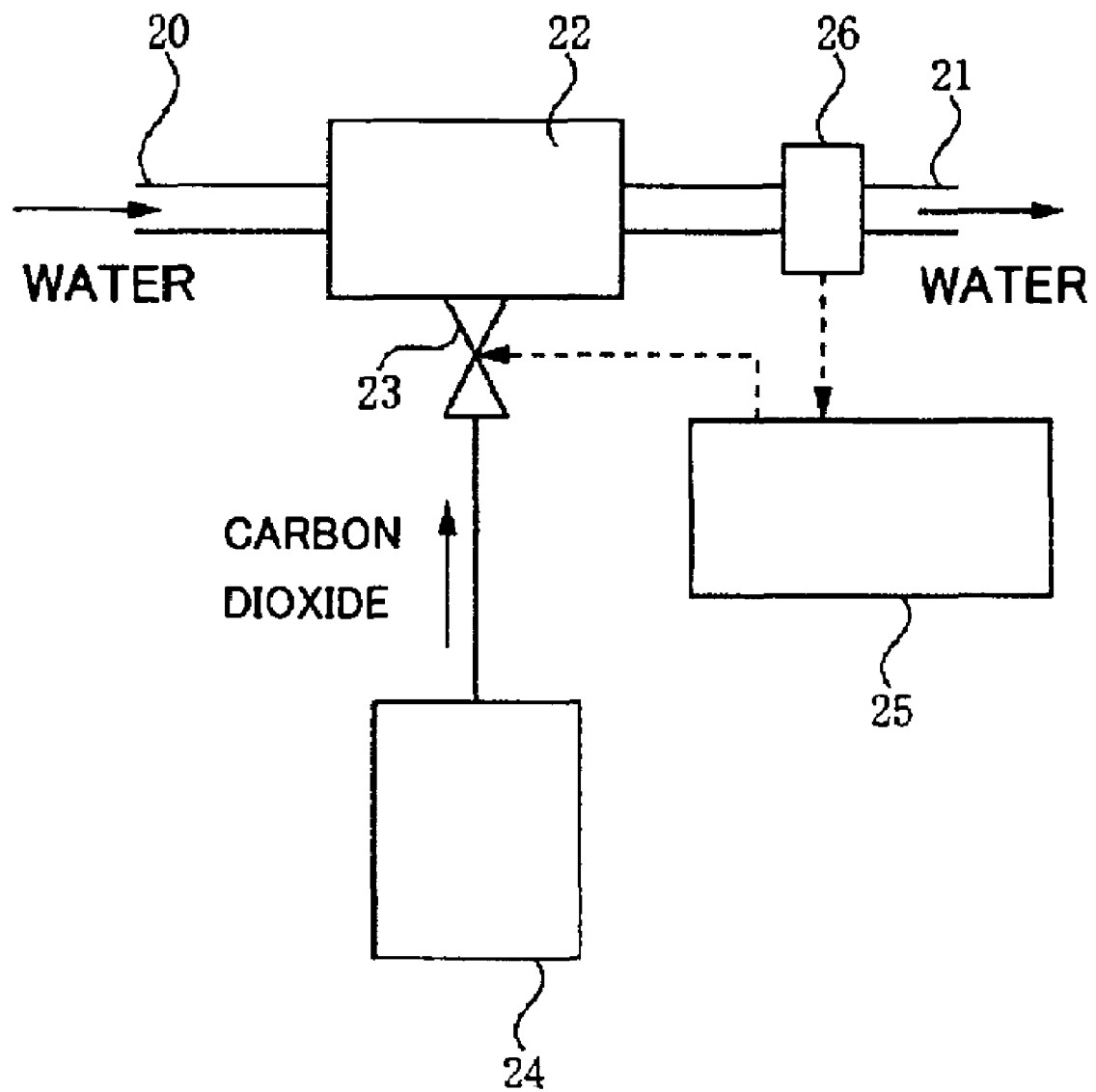
FIG. 2 is a schematic view showing a structural example of an injection unit of carbon dioxide.

This embodiment injects a predetermined concentration of carbon dioxide into the degassed water, prevents influence of gas bubbles to the exposure, and restrains the static electricity on the substrate. Carbon dioxide advantageously is inexpensive and does not contaminate the substrate. Referring to FIG. 2, a description will be given of one exemplary structure of the carbon dioxide injection unit 19. A membrane module 22 is provided between an inflow port 20 of the water and an outflow port 21. The membrane module 22 is connected to a supply source 24, such as a $CO_2$ cylinder, via a valve 23. The valve 23 is electrically controlled by a carbon dioxide controller 25.

This configuration restrains a concentration of the carbon dioxide in the water by changing the flow of the carbon dioxide to the membrane module 22 via the valve 23. A resistivity meter 26 is provided at a downstream side of the carbon dioxide injection unit. It is more preferable to control the concentration of the carbon dioxide within a predetermined range by electrically feeding back an output of the resistivity meter 26 to the carbon dioxide controller 25. Carbon dioxide gas may be injected into the water from a nozzle instead of using a membrane module. In this case, it is preferable to eliminate fine particles in the carbon dioxide gas using a filter in advance.

A description will now be given of an optimal concentration of carbon dioxide.

Figure 3:
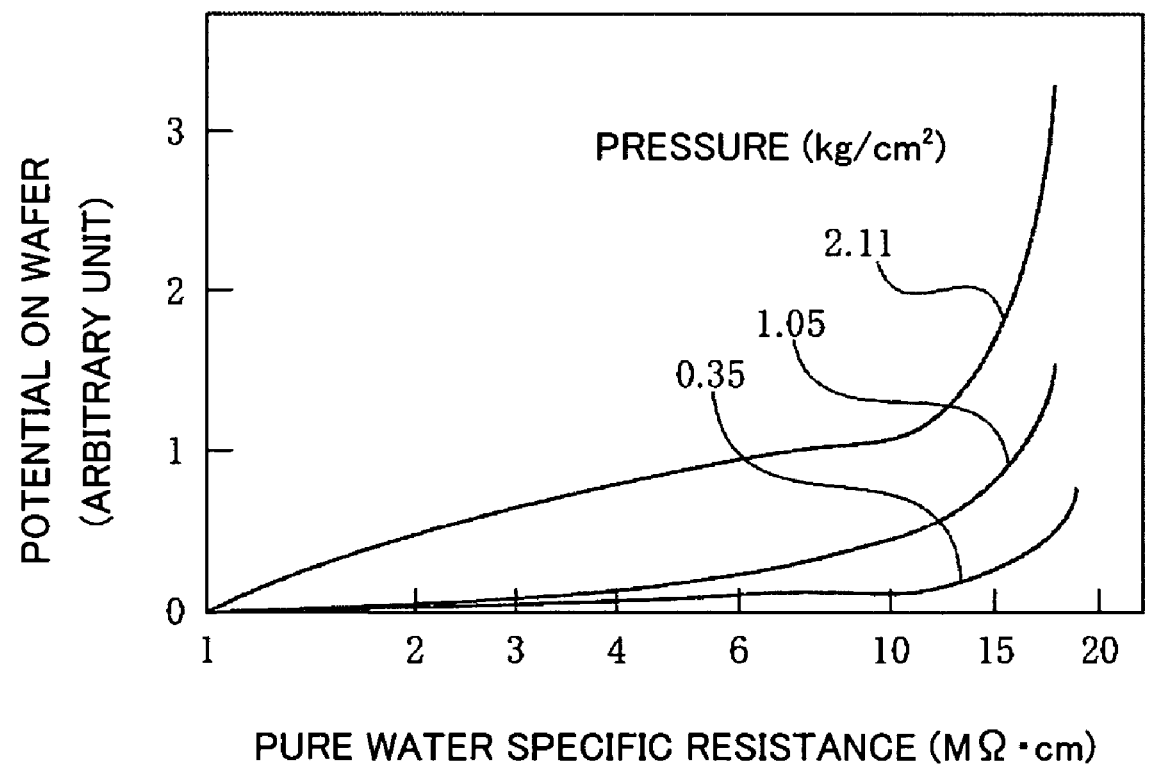
FIG. 3 is an explanatory view showing a relationship between a potential on a wafer and a pure water's resistivity in a wafer's cleansing step.
Figure 4:
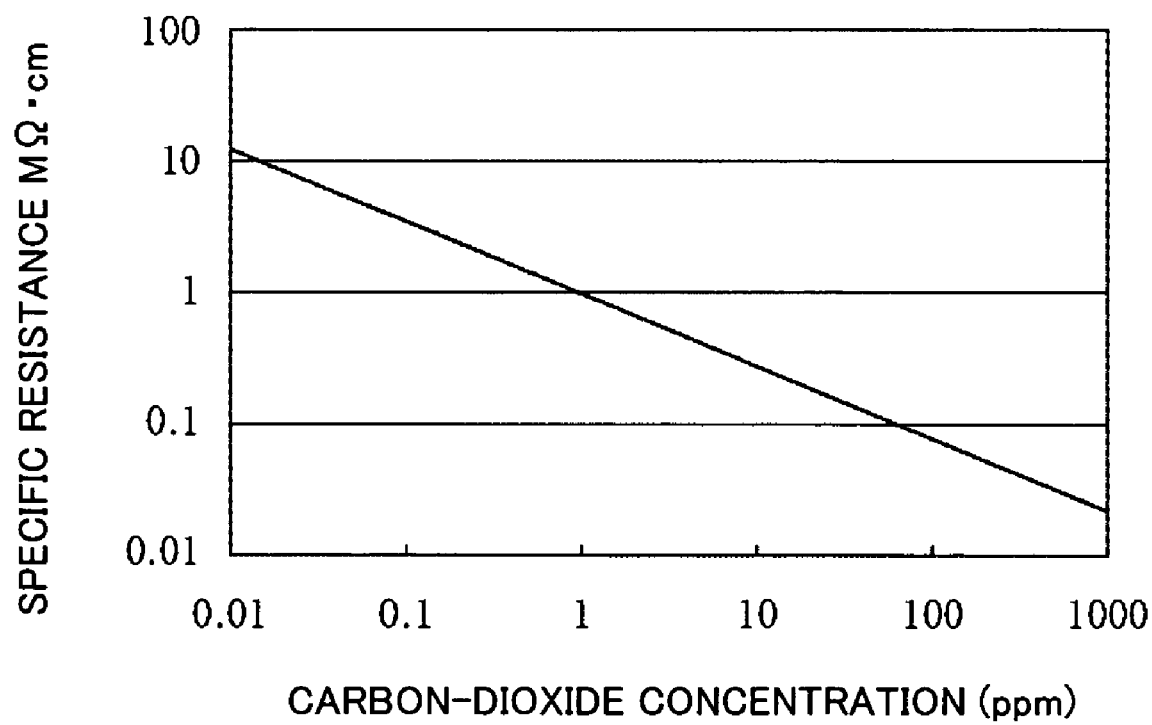
FIG. 4 is an explanatory view showing a relationship between the pure water's resistivity and the concentration of carbon dioxide.

The lower limit of the carbon-dioxide concentration is determined from the necessity to restrain the static electricity on the wafer. FIG. 3 shows a relationship between the potential on the wafer and the water's resistivity when the wafer is cleansed with pure water from the nozzle (as detailed in Asano, "Spray, Contact, Flow Charges of Pure Water and Ultra-pure Water", The Institute of Electrical Engineering of Japan, Vol. 108 (1988), pp. 362-366). It is understood from FIG. 3 that when the water's resistivity exceeds 10 MΩ·cm, the large potential is likely to generate on the wafer. On the other hand, when the water's resistivity is equal to or smaller than 5 MΩ·cm, the static electricity does not pose a problem. FIG. 4 shows a relationship between the carbon-dioxide concentration and the resistivity in the pure water. As the carbon-dioxide concentration increases, the resistivity decreases. The carbon-dioxide concentrations of 0.02 ppm and 0.06 ppm correspond to the resistivity of 10 MΩ·cm and 5 MΩ·cm. This means that the carbon-dioxide concentration in the water is preferably 0.02 ppm or greater, more preferably 0.06 ppm or greater, in order to restrain the static electricity on the wafer.

Figure 5:
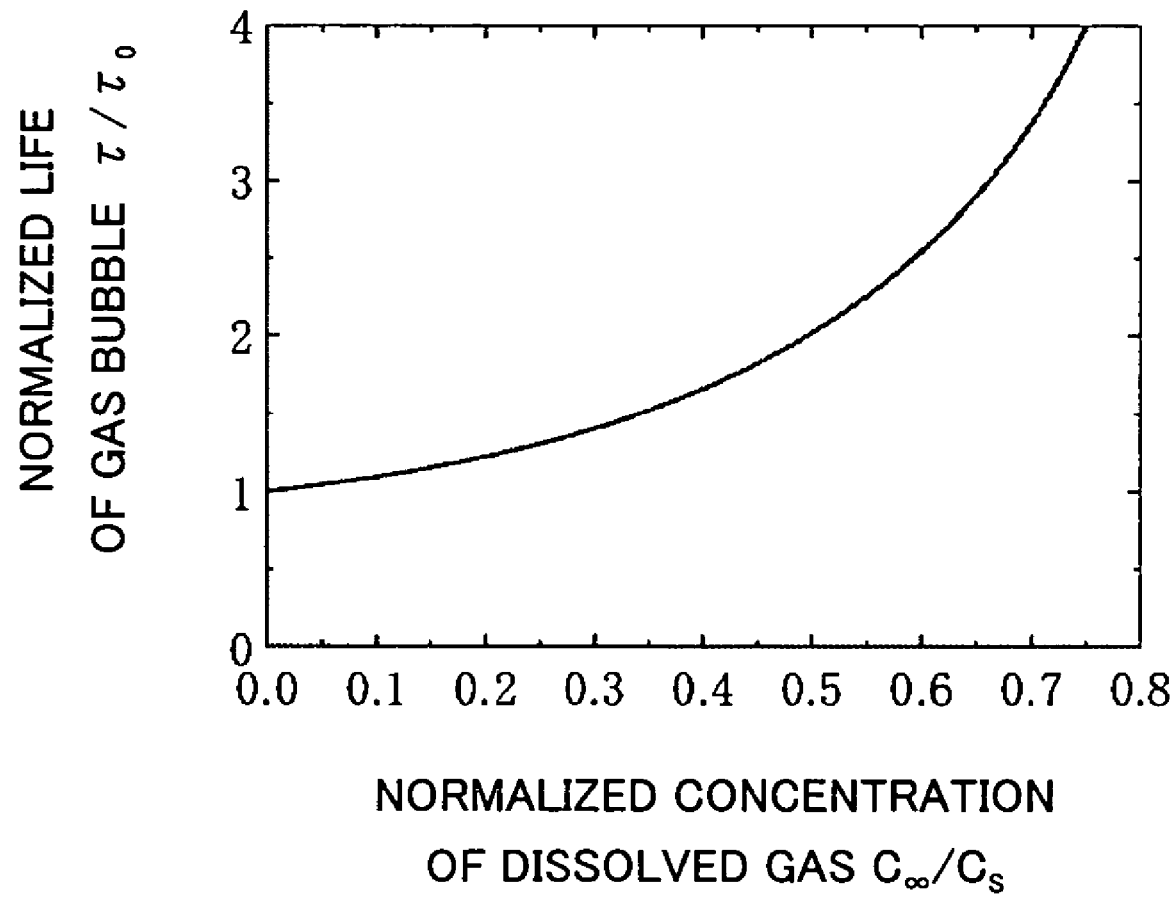
FIG. 5 is an explanatory view showing a relationship between a normalized life of a gas bubble and a normalized concentration of a dissolved gas.

The upper limit of the carbon-dioxide concentration can be determined from a problem of the gas bubbles. The gas-bubble generation is caused by a pressure variance in the water and inclusions of fine gas bubbles in the carbon-dioxide injection unit. In either case, as the carbon-dioxide concentration in the water increases, the gas bubble is likely to generate and its life (or a time period during which a generated gas bubble extinguishes due to diffusion) becomes long. In other words, the gas bubble is unlikely to extinguish and a danger of the influence of the gas bubbles to the exposure increases. FIG. 5 shows the normalized life $\tau/\tau_0$ of a gas bubble as a function of $C_\infty/C_s$ as a normalized concentration of dissolved gas (as detailed in C. E. Brennen, "Cavitation and Bubble Dynamics," Oxford University Press (1995), Chapter 2). Here, $\tau_0$ is the life when $C_\infty=0.0$ and Cs is a saturated concentration. When normalized concentration $C_\infty/C_s$ is 0.2 or smaller, the life of a gas bubble is close to $C_\infty=0.0$ and the gas bubble is likely to extinguish relatively immediately. On the other hand, when normalized concentration $C_\infty/C_s$ becomes 0.5 or greater, the life of a gas bubble drastically increases and gas bubble is unlikely to extinguish. As a result of this, in order to prevent the influence of the gas bubble to the exposure, the concentration of gas dissolved in the water is preferably 50% or smaller of the saturated concentration, and more preferably 20% or smaller of the saturated concentration. The saturated concentration of carbon dioxide in the water is about 1500 ppm in one air pressure. Therefore, in order to prevent the influence of the gas bubbles to the exposure, the carbon-dioxide concentration may be preferably 750 ppm or smaller, more preferably 300 ppm. These values are much greater than the lower limit of the carbon-dioxide concentration necessary to restrain the static electricity, and it is possible to reconcile the prevention of the gas bubble's influence with the restraint of the static electricity.

In summary, the carbon-dioxide concentration in the water supplied to the liquid film 4 ranges preferably from 0.02 ppm to 750 ppm, and more preferably from 0.06 ppm to 300 ppm. The equivalent condition is that the resistivity ranges preferably from 0.02 MΩ·cm to 10 MΩ·cm, and more preferably from 0.04 MΩ·cm to 5 MΩ·cm. This configuration prevents the influence of the gas bubbles to the exposure and restrains the static electricity on the substrate.

Figure 6:
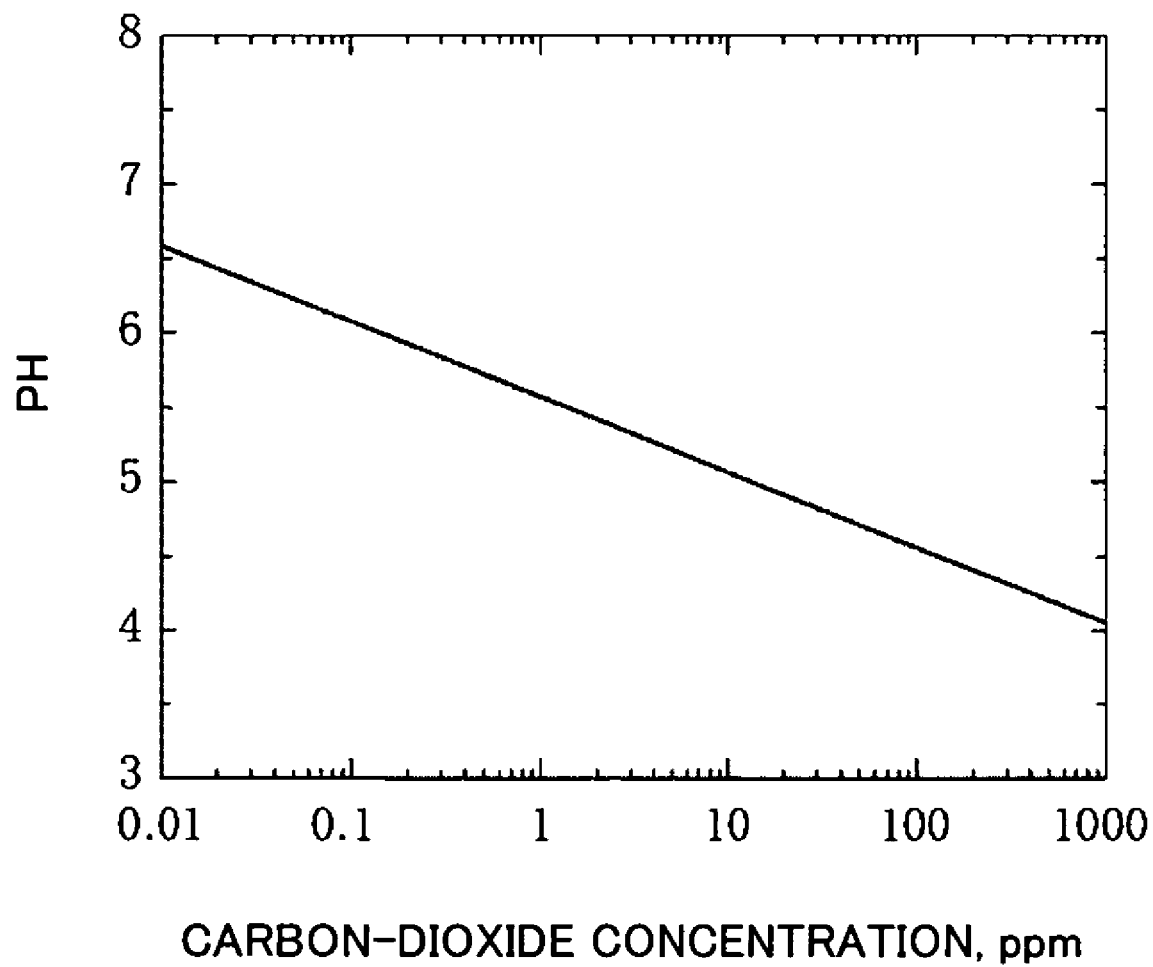
FIG. 6 is an explanatory view showing a relationship between a water's PH value and a concentration of the carbon dioxide.

This embodiment can implement an acid environment suitable for a chemical amplification type of resist. The chemical amplification type of resist is widely used as the highly sensitive resist optimal to the lithography that uses a KrF laser and an ArF laser for a light source. On the other hand, when alkali contaminations in the water, such as ammonia, enter the resist surface in the chemical amplification type of resist, a chemical reaction is restricted and a problem on the pattern, such as T-top, occurs. This embodiment decreases the PH value by dissolving carbon dioxide in the water, and restrains the influence of alkali contaminations. FIG. 6 shows a relationship between the water's PH value and the carbon-dioxide concentration.

Figure 7:
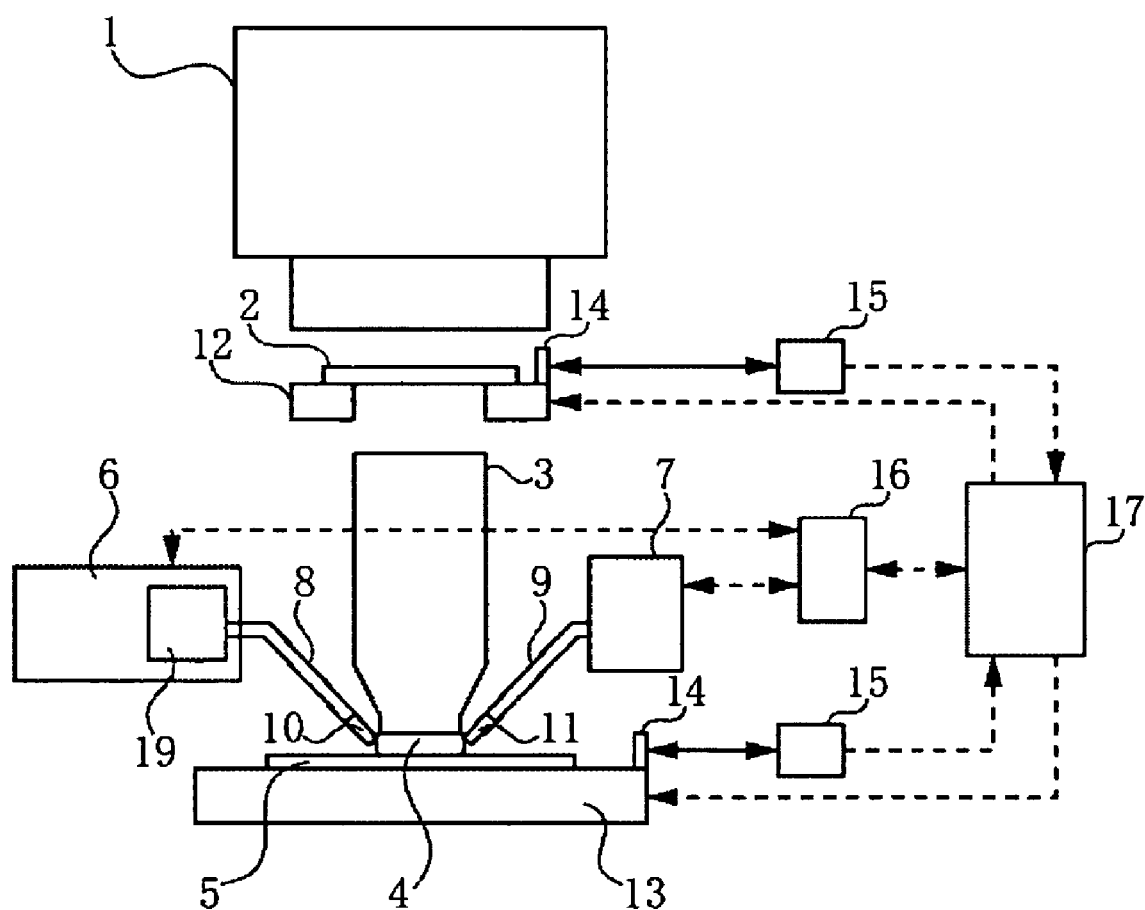
FIG. 7 is a schematic view showing a principal part of an exposure apparatus as a variation of the first embodiment.

Usually, the semiconductor factory has the pure water facility, and many of the pure water facilities have a degassing function. Where the degassed water is supplied from the pure water facility outside the exposure apparatus to the projection exposure apparatus, the projection exposure apparatus can omit the degassing unit 18. The omission of the degassing unit 18 would reduce the cost. FIG. 7 shows a variation of the exposure apparatus according to the instant embodiment that implements the above concept. The exposure apparatus as a variation differs from that shown in FIG. 1 in that the fluid supply unit 6 has no degassing unit. A structure of the carbon-dioxide injection unit, the optimal carbon-dioxide concentration in the water and resistivity in the exposure apparatus in this variation are the same as those in the exposure apparatus shown in FIG. 1.

Thus, the immersion exposure apparatus of this embodiment prevents the influence of the gas bubbles to the exposure and restrains the static electricity on the substrate.

Second Embodiment

A description will now be given of an embodiment of a device manufacturing method using the exposure apparatus of the first embodiment.

Figure 8:
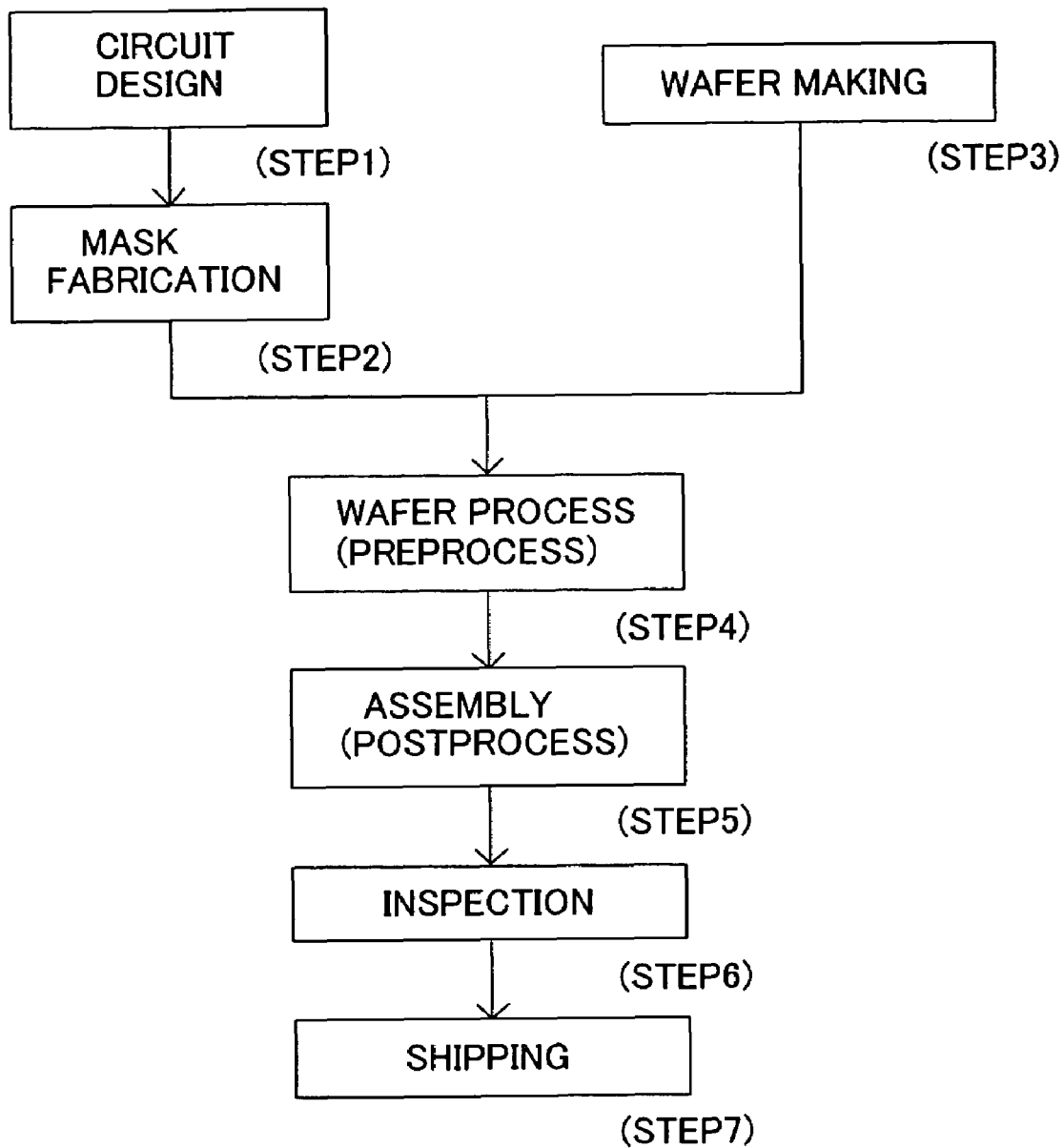
FIG. 8 is a manufacture flow of a device.

FIG. 8 is a flowchart for explaining a fabrication of devices (i.e., semiconductor chips such as IC and LSI, liquid crystal panels, and CCDs). Step 1 (circuit design) designs a device circuit. Step 2 (mask fabrication) forms a reticle having the designed circuit pattern. Step 3 (wafer making) manufactures a wafer using materials such as silicon. Step 4 (wafer process), which is referred to as a preprocess, forms actual circuitry on the wafer through photolithography using the mask and wafer. Step 5 (assembly), which is also referred to as a postprocess, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 9:
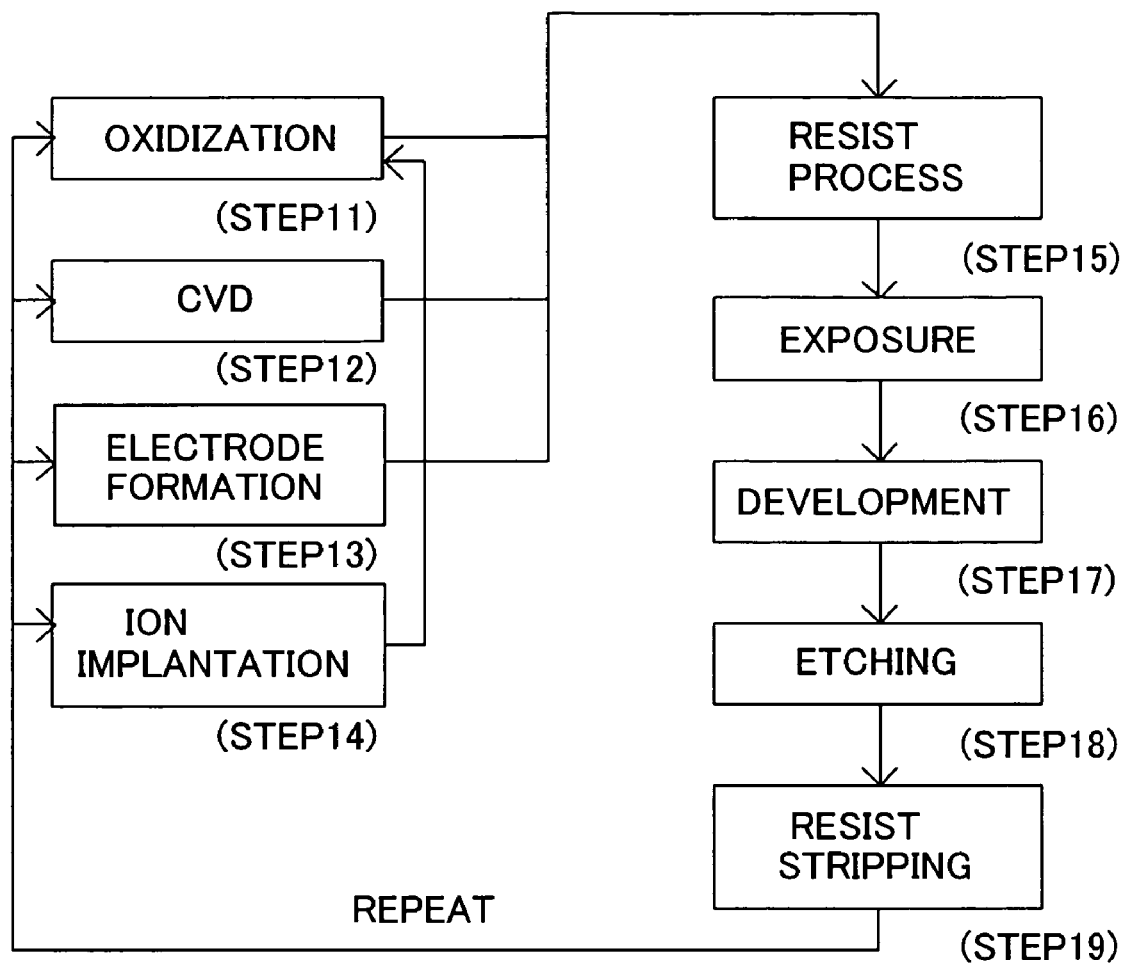
FIG. 9 is a wafer process shown in FIG. 8.

FIG. 9 is a detailed flow of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus of the first embodiment to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer.

The device fabrication method of this embodiment may manufacture higher quality devices than the conventional one.

The entire disclosure of Japanese Patent Application No. 2003-422932 filed on Dec. 19, 2003 including claims, specification, drawings, and abstract are incorporated herein by reference in its entirety.

As many apparently widely different embodiments of the present invention can be made without departing from the spirit and scope thereof, it is to be understood that the invention is not limited to the specific embodiments thereof except as defined in the claims.

INDUSTRIAL APPLICABILITY

The inventive exposure apparatus injects carbon dioxide into the fluid used for the immersion method, and restrains the static electricity that would otherwise generate on the substrate surface.

The inventive device manufacturing method can transfer an image of a device pattern on the mask onto a device substrate with high precision, and manufactures highly integrated devices, which are hard to manufacture in the prior art.

The invention claimed is:

1. An exposure apparatus comprising:
   a projection optical system for projecting a pattern of a mask onto a substrate; and
   a fluid supply unit for supplying a fluid between said projection optical system and the substrate, said fluid supply unit including an injection unit for injecting carbon dioxide into the fluid,
   wherein said fluid supply unit includes a degassing unit for degassing the fluid, said degassing unit being located at an upstream side of the injection unit.

2. An exposure apparatus according to claim 1, wherein said injection apparatus includes a membrane module for injecting the carbon dioxide.

3. An exposure apparatus according to claim 1, wherein the injection unit injects the carbon dioxide at a concentration of the carbon dioxide in the fluid between 0.02 ppm and 750 ppm.

4. An exposure apparatus according to claim 3, wherein the injection unit injects the carbon dioxide at the concentration of the carbon dioxide in the fluid between 0.06 ppm and 300 ppm.

5. An exposure apparatus according to claim 1, wherein the fluid supply unit includes a resistivity meter for measuring a resistivity value of the fluid, and the injection unit injects the carbon dioxide based on a measurement result of the resistivity meter.

6. An exposure apparatus according to claim 1, wherein the injection unit injects the carbon dioxide so that a resistivity value of the fluid is between 0.02 $M\Omega \cdot cm$ and 10 $M\Omega \cdot cm$.

7. An exposure apparatus according to claim 6, wherein the injection unit injects the carbon dioxide so that the resistivity value of the fluid is between 0.04 $M\Omega \cdot cm$ and 5 $M\Omega \cdot cm$.

8. A device manufacturing method comprising the steps of:
   exposing an object using an exposure apparatus according to claim 1 and developing the exposed object.

* * * * *